(12) United States Patent
Cho

(10) Patent No.: US 12,230,656 B2
(45) Date of Patent: Feb. 18, 2025

(54) IMAGE SENSING DEVICE INCLUDING GRID STRUCTURES HAVING DIFFERENT HEIGHTS

(71) Applicant: SK hynix Inc., Icheon-si (KR)

(72) Inventor: Min Su Cho, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 8 days.

(21) Appl. No.: 18/096,391

(22) Filed: Jan. 12, 2023

(65) Prior Publication Data

US 2023/0170362 A1 Jun. 1, 2023

Related U.S. Application Data

(62) Division of application No. 16/941,049, filed on Jul. 28, 2020, now Pat. No. 11,557,617.

(30) Foreign Application Priority Data

Feb. 4, 2020 (KR) .................... 10-2020-0013093

(51) Int. Cl.
   *H01L 27/146* (2006.01)
(52) U.S. Cl.
   CPC .. *H01L 27/14621* (2013.01); *H01L 27/14627* (2013.01)
(58) Field of Classification Search
   CPC ......... H01L 27/14609; H01L 27/14621; H01L 27/14625; H01L 27/14627; H01L 27/1463
   See application file for complete search history.

(56) References Cited

U.S. PATENT DOCUMENTS

2012/0081587 A1* 4/2012 Ryu ................. H01L 27/14605
                                                  348/E5.091
2016/0027829 A1* 1/2016 Wu .................. H01L 27/14629
                                                  257/432

(Continued)

FOREIGN PATENT DOCUMENTS

CN          103456751 A    12/2013
CN          105990383 A    10/2016
(Continued)

*Primary Examiner* — Nelson Garces
(74) *Attorney, Agent, or Firm* — Perkins Coie LLP

(57) ABSTRACT

An image sensing device is disclosed. The image sensing device includes a pixel array including a plurality of unit pixels, each of which is configured to generate a pixel signal in response to incident light. The pixel array includes a substrate layer including a plurality of photoelectric conversion elements configured to convert the incident light into an electric signal, a plurality of microlenses formed over the substrate layer to respectively correspond to the photoelectric conversion elements, and configured to converge the incident light into the corresponding photoelectric conversion elements, a plurality of color filters disposed between the plurality of photoelectric conversion elements and the plurality of microlenses and configured to transmit light at predetermined wavelengths to corresponding photoelectric conversion elements, and one or more grid structures disposed over the substrate layer at intervals to separate the microlenses and the color filters from adjacent microlenses and the color filter. The grid structures have different heights at different locations in the pixel array such that one or more of the grid structure include a top portion protruding from a top surface of an abutting microlens.

7 Claims, 5 Drawing Sheets

(56) References Cited

U.S. PATENT DOCUMENTS

| | | | |
|---|---|---|---|
| 2016/0079292 A1 | 3/2016 | Miyashita | |
| 2016/0172398 A1 | 6/2016 | Kim | |
| 2016/0276395 A1 | 9/2016 | Chou et al. | |
| 2018/0286904 A1* | 10/2018 | Tazoe | H01L 27/14621 |
| 2018/0358392 A1* | 12/2018 | Hsieh | H01L 27/14687 |
| 2019/0157329 A1* | 5/2019 | Kim | H01L 27/1464 |

FOREIGN PATENT DOCUMENTS

| | | |
|---|---|---|
| CN | 110620121 A | 12/2019 |
| KR | 10-1708807 B | 4/2012 |
| KR | 20120033702 A | 4/2012 |
| KR | 20150052695 A | 5/2015 |
| KR | 10-2016-0016015 A | 2/2016 |
| KR | 20190057601 A | 5/2019 |

\* cited by examiner

IMAGE SENSING DEVICE INCLUDING GRID STRUCTURES HAVING DIFFERENT HEIGHTS

CROSS-REFERENCE TO RELATED APPLICATION

This patent document is a divisional of U.S. patent application Ser. No. 16/941,049, filed on Jul. 28, 2020, which claims the priority and benefits of Korean patent application No. 10-2020-0013093, filed on Feb. 4, 2020. The entire contents of the above applications are incorporated by reference as part of the disclosure of this patent document.

TECHNICAL FIELD

The technology and implementations disclosed in this patent document generally relate to an image sensing device.

BACKGROUND

An image sensor is a device for converting an optical image into electrical signals. With the recent development of automotive, medical, computer and communication industries, the demand for high-performance image sensors is rapidly increasing in various devices such as digital cameras, camcorders, personal communication systems (PCSs), game consoles, surveillance cameras, medical micro-cameras, robots, etc.

SUMMARY

Various embodiments of the disclosed technology relate to an image sensing device capable of improving shading characteristics caused by lenses.

In an embodiment of the disclosed technology, an image sensing device may include a pixel array including a plurality of unit pixels, each of which is configured to generate a pixel signal in response to incident light. The pixel array may include a substrate layer including a plurality of photoelectric conversion elements configured to convert the incident light into an electric signal, a plurality of microlenses formed over the substrate layer to respectively correspond to the photoelectric conversion elements, and configured to converge the incident light into the corresponding photoelectric conversion elements, a plurality of color filters disposed between the plurality of photoelectric conversion elements and the plurality of microlenses and configured to transmit light at predetermined wavelengths to corresponding photoelectric conversion elements, and one or more grid structures disposed over the substrate layer at intervals to separate the microlenses and the color filters from adjacent microlenses and the color filters. The grid structures may have different heights at different locations in the pixel array such that one or more of the grid structure include a top portion protruding from a top surface of an abutting microlens.

In another embodiment of the disclosed technology, an image sensing device may include a pixel array including a plurality of unit pixels, each of which is configured to generate a pixel signal corresponding to incident light.

The pixel array may include a substrate layer including a plurality of photoelectric conversion elements configured to convert the incident light into an electric signal, one or more grid structures disposed at intervals over the substrate layer, and configured to have different heights at different locations in the pixel array, a plurality of color filters disposed in a spacing defined by the grid structures and configured to transmit light at predetermined wavelengths to corresponding photoelectric conversion elements, and a plurality of microlenses disposed over the color filters. The plurality of microlenses may be consecutively arranged and, as a whole, forms a curved shape that is thinner at a center portion of the pixel array and thicker at an edge portion of the pixel array.

In another embodiment of the disclosed technology, an embodiment of the disclosed technology, an image sensing device may include a pixel array in which a plurality of unit pixels, each of which is configured to generate a pixel signal corresponding to incident light, is arranged. The pixel array may include a substrate layer provided with a plurality of photoelectric conversion elements configured to perform photoelectric conversion of the incident light, a plurality of microlenses formed over the substrate layer so as to respectively correspond to the photoelectric conversion elements, and configured to converge the incident light into the corresponding photoelectric conversion elements, a plurality of color filters configured to filter out visible light from light having penetrated the microlenses, and one or more grid structures disposed over the substrate layer so as to define a region in which the microlenses and the color filters are formed. The grid structures may be formed in a manner that some regions thereof protrude outward from a spacing between the microlenses and have different heights according to where they are formed in the pixel array.

In another embodiment of the disclosed technology, an image sensing device may include a pixel array in which a plurality of unit pixels, each of which is configured to generate a pixel signal corresponding to incident light, is arranged.

The pixel array may include a substrate layer provided with a plurality of photoelectric conversion elements configured to perform photoelectric conversion of the incident light, one or more grid structures disposed over the substrate layer, and configured to have different heights according to where the grid structures are formed in the pixel array, a plurality of color filters disposed in a spacing defined by the grid structures, and configured to filter out visible light from the incident light, and a plurality of microlenses disposed over the color filters. The plurality of microlenses may be formed in a curved shape in which the microlenses gradually increase in height in a direction from a center portion of the pixel array to an edge portion of the pixel array and contiguous microlenses are consecutively coupled to one another.

It is to be understood that both the foregoing general description and the following detailed description of the disclosed technology are illustrative and explanatory and are intended to provide further explanation of the disclosure as claimed.

DETAILED DESCRIPTION

This patent document provides implementations and examples of an image sensing device that can mitigate shading and optical crosstalk issues caused by lenses. In some implementations of the disclosed technology, an image sensing device can mitigate such issues by increasing the amount of light incident upon photoelectric conversion elements such as photodiodes, while minimizing expansion of the air layer within the grid structure.

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

Figure 1:
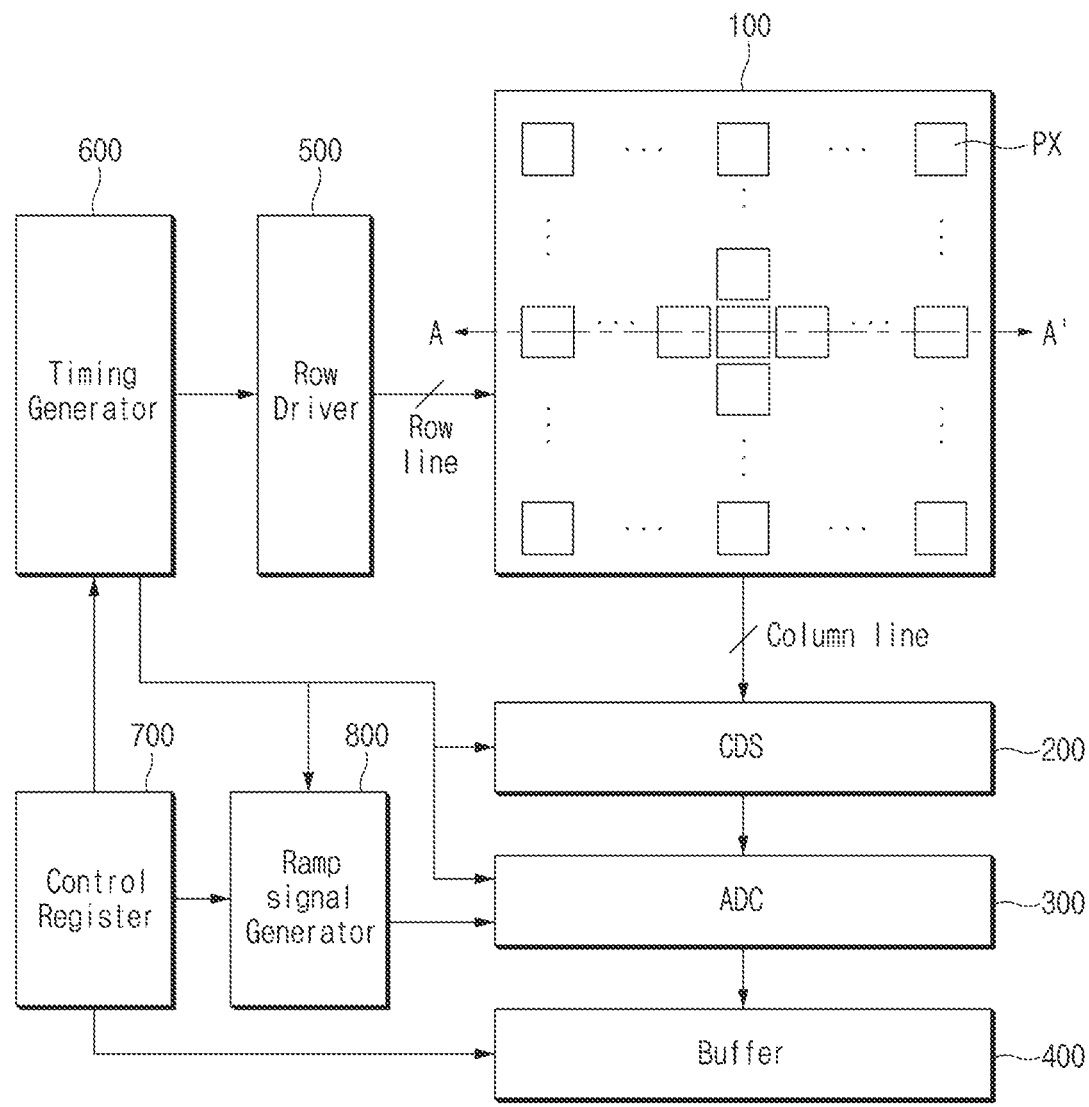
FIG. 1 is an example of a block diagram illustrating an image sensing device based on some implementations of the disclosed technology.

FIG. 1 is a block diagram illustrating an example of an image sensing device based on some implementations of the disclosed technology.

In some implementations, the image sensing device may include a pixel array 100, a correlated double sampler (CDS) 200, an analog-to-digital converter (ADC) 300, a buffer 400, a row driver 500, a timing generator 600, a control register 700, and a ramp signal generator 800.

The pixel array 100 may include unit pixels (PXs) consecutively arranged in rows and columns in a two-dimensional (2D) array. Each of the unit pixels (PXs) may convert incident light into an electrical signal to generate a pixel signal, which is sent to the correlated double sampler (CDS) 200 through column lines. Each unit pixel (PX) may include one or more photoelectric conversion elements formed in a substrate. In some implementations, the substrate may include a first surface upon which light reception structures are formed and a second surface facing away from the first surface. The light reception structures can allow incident light to converge upon the photoelectric conversion elements of unit pixels. The light reception structure may include color filters, one or more grid structures, and microlenses. The pixel array 100 implemented based on some embodiments of the disclosed technology may include a light reception structure capable of mitigating shading effects, as will be discussed below.

The correlated double sampler (CDS) 200 may be used to remove an undesired offset value of pixels by sampling a pixel signal twice to remove the difference between these two samples. In some implementations, the correlated double sampler (CDS) 200 may sample and hold electrical image signals received from the pixels (PXs) of the pixel array 100. For example, the correlated double sampler (CDS) 200 may perform sampling of a reference voltage level and a voltage level of the received electrical image signal in response to a clock signal received from the timing generator 600, and may generate an analog signal corresponding to a difference between the reference voltage level and the voltage level of the received electrical image signal. The analog signal is sent to the analog-to-digital converter (ADC) 300 for digitalization.

The analog-to-digital converter (ADC) circuit 300 is used to convert analog signals to digital signals. Examples of the analog-to-digital converter (ADC) circuit 300 may include a ramp-compare type analog-to-digital converter that compares the analog pixel signal with a reference signal such as a ramp signal that ramps up or down, and a timer counts until a voltage of the ramp signal matches the analog signal. In some implementations, the analog-to-digital converter (ADC) 300 may compare a ramp signal received from the ramp signal generator 800 with a sampling signal received from the correlated double sampler (CDS) 200 to determine whether the voltage level of the ramp signal matches the voltage level of the sampling signal. The analog-to-digital converter (ADC) 300 may receive clock signals from the timing generator 600 to count the clock signals until the voltage level of the ramp signal matches the voltage level of the sampling signal, and may output a count value as a converted digital signal to the buffer 400.

The buffer 400 may temporarily store each of the digital signals received from the analog-to-digital converter (ADC) 300, and may sense and amplify each of the digital signals to output each of the amplified digital signals. Therefore, the buffer 400 may include a memory (not shown) and a sense amplifier (not shown). The memory may store the count value, which is a digital signal converted from the output signals of the plurality of unit pixels (PXs). The sense amplifier may sense and amplify each count value received from the memory.

The row driver 500 may selectively activate the pixel array 100 on a row line basis in response to an output signal of the timing generator 600. For example, the row driver 500 may generate a selection signal to select any one of the plurality of row lines.

The timing generator 600 may generate a timing signal to control the operations of the row driver 500, the correlated double sampler (CDS) 200, the analog-to-digital converter (ADC) 300, and the ramp signal generator 800.

The control register 700 may generate control signals to control the operations of the ramp signal generator 800, the timing generator 600, and the buffer 400.

The ramp signal generator 800 may generate a ramp signal to process an image signal transmitted to the buffer 400 in response to a control signal received from the control register and a timing signal received from the timing generator 600.

Figure 2:
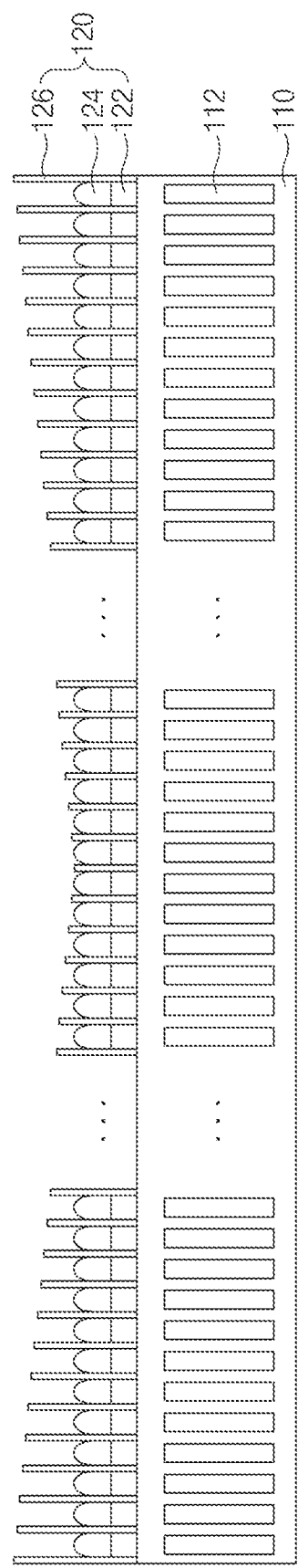
FIG. 2 is a cross-sectional view illustrating an example of a pixel array taken along the line A-A' shown in FIG. 1.

FIG. 2 is a cross-sectional view illustrating an example of the pixel array 100 taken along the line A-A' shown in FIG. 1.

In some implementations, the pixel array 100 of the image sensing device may include a substrate layer 110 and a light reception layer 120.

The substrate layer 110 may include a semiconductor substrate. The semiconductor substrate may include a first surface upon which the light reception layer 120 is disposed and a second surface facing away from the first surface. The semiconductor substrate 110 may include a material in a monocrystalline state. In one example, the semiconductor substrate 110 may include a silicon-containing material. That is, the semiconductor substrate 110 may include a monocrystalline silicon-containing material. The semiconductor substrate 110 may include P-type impurities diffused or implanted therein. The semiconductor substrate 110 may include photoelectric conversion elements 112 such that each unit pixel (PX) includes one of the photoelectric conversion elements 112. Each of the photoelectric conversion elements 112 may convert incident light received through a light reception layer 120 into an electrical signal.

Each of the photoelectric conversion elements 112 may include an organic or inorganic photodiode. The photoelectric conversion element 112 may include impurity regions vertically stacked within the semiconductor substrate layer 110. For example, each of the photoelectric conversion elements 112 may include a photodiode in which an N-type impurity region and a P-type impurity region are vertically stacked on top of one another. The N-type impurity region and the P-type impurity region may be formed by ion implantation. The photoelectric conversion elements 112 may be isolated from adjacent photoelectric conversion elements, thereby unit pixels are isolated from each other by device isolation layers (not shown). The device isolation layer may include a deep trench isolation (DTI) structure.

The disclosed technology may be implemented in various embodiments to provide a pixel array of the image sensing device that includes microlenses and grid structures disposed therebetween that are formed to have different thicknesses depending on their locations in the pixel array such that the thicknesses of the microlenses at edges of the imaging pixel array are thicker than those at the center of the imaging pixel array.

The light reception layer 120 may be formed over the first surface of the substrate layer 110. The light reception layer 120 may include a color filter layer 122, a lens layer 124, and a grid structure 126.

The color filter layer 122 may include optical filters located above the photoelectric conversion elements 112 to filter the light to be detected by the photoelectric conversion elements 112. In some implementations, the color filter layer 122 may transmit visible light at a certain wavelength while blocking light at other wavelengths. The color filter layer 122 may include a plurality of color filters. Each unit pixel (PX) includes at least one color filter structured to fill the lower parts of the gaps between the grid structures 126. For example, the color filter layer 122 may include a plurality of red color filters (Rs), a plurality of green color filters (Gs), and a plurality of blue color filters (Bs) such that each unit pixel (PX) includes a red color filter, a green color filter, or blue color filter. Each red color filter (R) may transmit only red light from among RGB lights of visible light. Each green color filter (G) may transmit only green light from among RGB lights of visible light. Each blue color filter (B) may transmit only blue light from among RGB lights of visible light. In an implementation, the red color filters (Rs), the green color filters (Gs), and the blue color filters (Bs) may be arranged in a Bayer pattern. In another implementation, the color filter layer 122 may include a plurality of cyan color filters, a plurality of yellow color filters, and a plurality of magenta color filters.

The lens layer 124 may converge incident light and direct the converged light onto the color filter layers 122. To this end, the lens layer 124 may be disposed over the color filter layer 122, and, in some implementations, each microlens of the lens layer 124 may be formed in each space defined by the grid structures 126. For example, the lens layer 124 may include microlenses formed over the respective color filters, and the microlenses may be formed in the spaces defined by the grid structures 126 in a manner that the microlenses are lower in height than the grid structures 126. In some embodiments of the disclosed technology, the microlenses may have the same or similar size. For example, the microlenses may have the same or similar height and the same or similar width to have the same or similar radius of curvature (RoC).

The grid structures 126 are arranged at intervals over the upper portion of the substrate layer 110. Each pair of color filter and microlens is formed between two adjacent grid structures 126, which are formed to prevent optical crosstalk from occurring between adjacent color filters. In some implementations, the grid structures 126 may have different heights according to where they are formed in the pixel array 100. For example, the grid structures 126 may be formed to gradually increase in height in the direction from the center portion of the pixel array 100 to the edge portion of the pixel array 100.

In an implementation where an objective lens (not shown) disposed over the pixel array 100 and incident light is converged on the pixel array 100 by the objective lens, the incident light at the center portion of the pixel array 100 propagates in a direction substantially perpendicular to the plane on which the pixel array 100 is arranged. Different from the light at the center portion of the pixel array 100, the incident light at the edge portion of the pixel array 100 propagates obliquely with respect to the optical axis of the pixel array 100. The closer it gets to the edge of the pixel array 110, the larger the angle of incidence of the light. This may lead to shading phenomenon, and thus the edge portion of the image obtained from the pixel array 100 appears darker than the image from the center portion of the pixel array 100.

In order to avoid or minimize such shading, the image sensing device based on some implementations of the disclosed technology may allow the grid structures 126 to have different heights depending on their locations in the pixel array such that the height of the grid structure is shortest at the center portion of the pixel array 100 (or shorter at the center portion than the edge portion) and gradually increase as approaching the edge portion of the pixel array 100. As such, the grid structures 126 may be formed in a manner that top surfaces of the grid structures 126 protrude from the top surface of the lens layer 124, more at the edge portion than at the center portion.

Figure 3A:
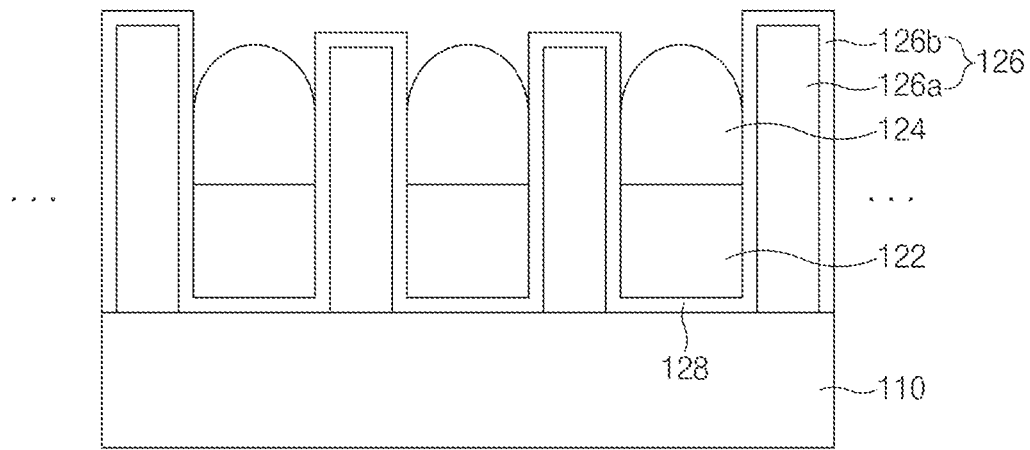
FIG. 3A is a cross-sectional view illustrating an example of a grid structure shown in FIG. 2.

FIG. 3A is a cross-sectional view illustrating an example of the grid structure shown in FIG. 2, focusing on only some grid structures formed at the center portion of the pixel array 100.

In some implementations, the grid structures 126 can include a low-index material layer that is structured to separate the plurality of color filters from one another to provide optical isolation between adjacent color filters. In one example, the grid structures 126 may include a low-index layer such as an air layer 126a and a capping film 126b structured to cover the air layer 126a.

The capping film 126b may be the outermost layer of the multi-layer grid structure 126.

In some implementations, the grid structure 126 may be formed in a manner that some parts of the air layer 126a protrude outward from the lens layer 124. Specifically, as can be seen from FIG. 2, the grid structures 126 may have different heights depending on their locations in the pixel array such that the height of the grid structure is shortest at the center portion of the pixel array 100 and gradually increase in height as approaching the edge portion of the pixel array 100. The air layer 126a formed to protrude outward from the lens layer 124 as described above can increase light reflection over the color filter layer 122, directing more light rays into photoelectric conversion elements of each unit pixel.

In addition, the protruding portion of the air layer 126a can help prevent rupture by distributing pressure across the protruding portion of the air layer 126a when the air layer 126a expands.

If the lens layer or the color filter layer is formed to cover the top surface of the grid structure, the pressure applied across the air layer may affect the color filter layer and the lens layer, and at worst the grid structure may be collapsed or ruptured. However, the protruding structure of the air layer 126a implemented based on some embodiments of the disclosed technology can prevent the pressure from exceeding the allowable level by allowing air contained in the air layer 126a to be discharged outside through the capping film 126b of the protruded portion of the air layer.

To this end, the capping film 126b may be formed of a material film that allows air of the air layer to be discharged outside therethrough. For example, the capping film 126b may include an ultra low temperature oxide (ULTO) film such as a silicon oxide film ($SiO_2$). The capping film 126b may be formed as thin as possible to discharge air of the air layer 126a outside. In some implementations, the capping film 126b may be formed to a thickness of 300 Å or less.

The capping film 126b may be formed to extend to a region below the color filter layer 122. That is, the capping film 126b may be formed to extend to a region between the substrate layer 110 and the color filter layer 122. In some implementations, the capping film 128 formed below the color filter layer 122 may operate as a buffer layer for planarization of the layers on the substrate layer 110.

As described above, the grid structures 126 based on some implementations of the disclosed technology may be formed to have different heights depending on their locations in the pixel array such that the height of the grid structure is shorter at the center portion of the pixel array 100 and gradually increase in height as approaching the edge portion of the pixel array 100, reducing shading effects. In addition, the grid structure 126 may include the protruding portion at the spacing between the microlenses, such that the amount of light incident upon each photoelectric conversion element of the pixel array 100 may increase and the air layer 126a can be prevented from excessively expanding.

Figure 3B:
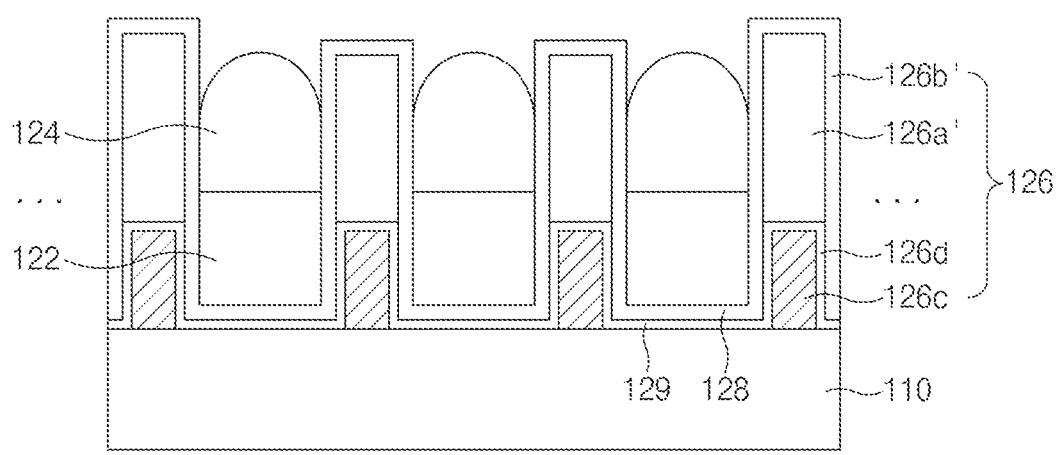
FIG. 3B is a cross-sectional view illustrating another example of the grid structure shown in FIG. 2.

FIG. 3B is a cross-sectional view illustrating another example of the grid structure 126 shown in FIG. 2.

In some implementations, the grid structure 126 may include an air layer 126a', a capping film 126b', a metal layer 126c, and an insulation film 126d. In other words, the grid structure 126 may be formed as a hybrid structure composed of the air layer 126a' and the metal layer 126c.

The capping film 126b' may be a material film formed at the outermost layer of the grid structure 126, and may cover the air layer 126a', the metal layer 126c, and the insulation film 126d.

The capping film 126b' shown in FIG. 3B may be identical in material and structure to the capping film 126b shown in FIG. 3A.

As can be seen from FIG. 3B, the grid structure 126 may be formed in a manner that some parts of the air layer 126a' protrude outward from the lens layer 124. The metal layer 126c may be formed below the air layer 126a'. For example, the metal layer 126c may be formed between the substrate layer 110 and the air layer 126a'. The metal layer 126c may include tungsten (W). Alternatively, the metal layer 126c may include a tungsten film and a barrier metal layer formed below the tungsten film.

The insulation film 126d may be formed to cover a top surface and side surfaces of the metal layer 126c, such that expansion of such metal material can be prevented in a thermal annealing process. For example, the insulation film 126d may be formed between the air layer 126a' and the metal layer 126c and between the capping film 126b' and the metal layer 126c.

The insulation film 126d may be formed to extend to a region below the color filter layer 122 in the same manner as in the capping film 126b'. The capping film 128 and the insulation film 129 formed below the color filter layer 122 may be used as a buffer layer formed between the substrate layer 110 and the color filter layer 122.

Figure 4:
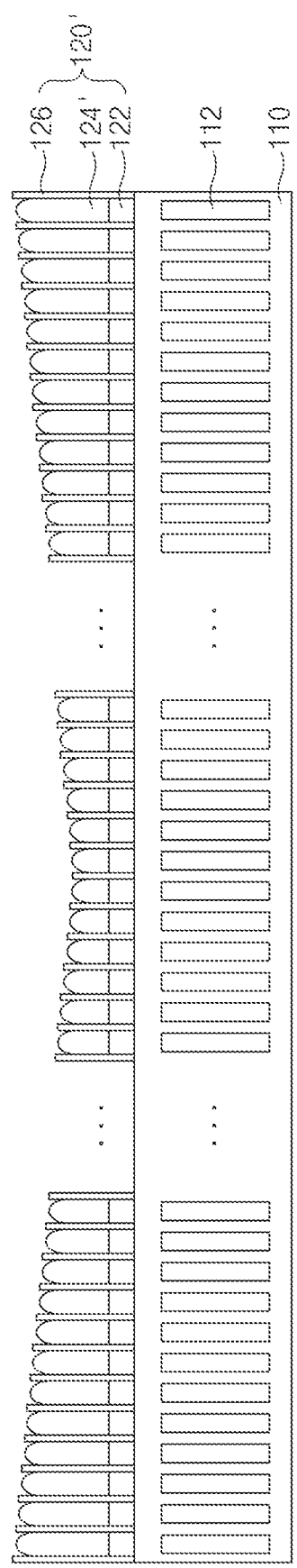
FIG. 4 is a cross-sectional view illustrating another example of the pixel array taken along the line A-A' shown in FIG. 1.

FIG. 4 is a cross-sectional view illustrating another example of the pixel array 100 taken along the line A-A' shown in FIG. 1.

In some implementations, the pixel array 100 of the image sensing device may include a substrate layer 110 and a light reception layer 120'.

The substrate layer 110 shown in FIG. 4 is identical in structure to the substrate layer 110 shown in FIG. 2, and as such a detailed description thereof will herein be omitted for brevity.

The light reception layer 120' may be disposed over the first surface of the substrate layer 110, and may include a color filter layer 122, a lens layer 124', and a grid structure 126.

The color filter layer 122 may include optical filters located above the photoelectric conversion elements 112 to filter the light to be detected by the photoelectric conversion elements 112. In some implementations, the color filter layer 130 may transmit visible light at a certain wavelength while blocking light at other wavelengths. The color filter layer 122 may include a plurality of color filters. Each unit pixel (PX) includes at least one color filter structured to fill the lower parts of the gaps between the grid structures 126.

The lens layer 124' may converge incident light and direct the converged light onto the color filter layer 122. To this end, the lens layer 124' may be disposed over the color filter layer 122, in some implementations, each microlens of the lens layer 124' may be formed in each space defined by the grid structures 126. Specifically, the lens layer 124' may include a plurality of microlenses corresponding to the respective unit pixels, and the microlenses may have different heights depending on positions of the corresponding unit pixels. For example, the microlenses may be formed to have different heights depending on their locations in the pixel array such that the heights of the microlenses are shortest at the center portion of the pixel array 100 and gradually increase in height as approaching the edge portion of the pixel array 100. However, RoC (radius of curvature) values of the microlenses may be identical or similar to each other irrespective of the position of the unit pixels.

The grid structures 126 may be arranged at intervals over the upper portion of the substrate layer 110. Each pair of color filter and microlens is formed between two adjacent grid structures 126, which are formed to prevent optical crosstalk from occurring between adjacent color filters. In some implementations, the grid structure 126 may have different heights depending on their locations in the pixel array such that the height of the grid structure is shortest at the center portion of the pixel array 100 (or shorter at the center portion than the edge portion) and gradually increase in height as approaching the edge portion of the pixel array 100. In addition, the grid structure 126 may include a structure composed of the air layer and the capping film as shown in FIG. 3A, or may include a structure composed of the metal layer, the air layer, and the capping film as shown in FIG. 3B. In this case, the grid structure 126 may protrude from the lens layer 124', and some parts of the air layer may protrude outward from the spacing between the microlenses of the lens layer 124'.

As shown in FIG. 4, the pixel array implemented based on some embodiments of the disclosed technology may be formed in a manner that both the grid structures 126 and the lens layers 124' have different heights depending on their locations in the pixel array such that the height of the grid structure and the lens layers 124' are shortest at the center portion of the pixel array 100 (or shorter at the center portion than the edge portion) and gradually increase in height as approaching the edge portion of the pixel array 100.

Figure 5:
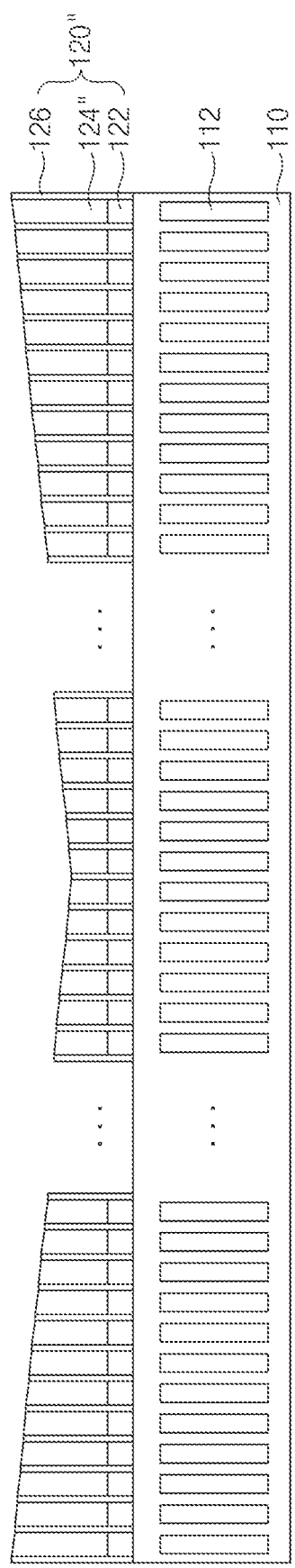
FIG. 5 is a cross-sectional view illustrating still another example of the pixel array taken along the line A-A' shown in FIG. 1.

FIG. 5 is a cross-sectional view illustrating still another example of the pixel array 100 taken along the line A-A' shown in FIG. 1.

In some implementations, the pixel array 100 of the image sensing device may include a substrate layer 110 and a light reception layer 120".

The substrate layer 110 shown in FIG. 5 is identical or similar to the substrate layer 110 shown in FIG. 2, and thus can be implemented in the same way as discussed above.

The light reception layer 120" may be disposed over the first surface of the substrate layer 110, and may include a color filter layer 122, a lens layer 124", and a grid structure 126.

The color filter layer 122 may include optical filters located above the photoelectric conversion elements 112 to filter the light to be detected by the photoelectric conversion elements 112. In some implementations, the color filter layer 130 may transmit visible light at a certain wavelength while blocking light at other wavelengths. The color filter layer 122 may include a plurality of color filters. Each unit pixel (PX) includes at least one color filter structured to fill the lower parts of the gaps between the grid structures 126.

The lens layer 124" may converge incident light and direct the converged light onto the color filter layer 122. The lens layer 124" may include a plurality of microlenses corresponding to the respective unit pixels, and the microlenses may have different heights depending on their locations in the pixel array. Specifically, the lens layer 124" may have different heights depending on their locations in the pixel array such that the height of the lens layer 124" is shortest at the center portion of the pixel array 100 (or shorter at the center portion than the edge portion) and gradually increase in height as approaching the edge portion of the pixel array 100, thereby forming a curved shape as a whole. For example, the thickness of the lens layer 124" may gradually increase as approaching the edge portion of the pixel array 100 from the center portion of the pixel array 100. In this case, each of the microlenses may not be formed to have a curved RoC (radius of curvature) value, and the contiguous (or adjacent) microlenses may be consecutively arranged.

The grid structures 126 are arranged at intervals over the upper portion of the substrate layer 110. Each pair of color filter and microlens is formed between two adjacent grid structures 126 to prevent optical crosstalk from occurring between color filters contiguous to each other. The grid structure 126 may gradually increase in height as approaching the edge portion of the pixel array 100 from the center portion of the pixel array 100, as depicted in FIG. 2 or FIG. 4. In addition, the grid structure 126 may include a structure composed of the air layer and the capping film as shown in FIG. 3A, or may include a structure composed of the metal layer, the air layer, and the capping film as shown in FIG. 3B.

As is apparent from the above description, the image sensing device based on the embodiments of the disclosed technology can reduce shading effects that can be caused by lenses.

The image sensing device based on the embodiments of the disclosed technology can increase the amount of light incident upon photoelectric conversion elements, while preventing expansion of the air layer within the grid structure.

Those skilled in the art will appreciate that the embodiments may be carried out in other specific ways than those set forth herein.

Although a number of illustrative embodiments have been described, it should be understood that numerous other modifications and embodiments can be devised based on what is disclosed and/or illustrated.

What is claimed is:

1. An image sensing device comprising:
 a pixel array including a plurality of unit pixels, each of which is configured to generate a pixel signal corresponding to incident light;
 wherein the pixel array includes:
 a substrate layer including a plurality of photoelectric conversion elements configured to convert the incident light into an electric signal;
 one or more grid structures disposed at intervals over the substrate layer, and configured to have different heights at different locations in the pixel array;
 a plurality of color filters disposed in a spacing defined by the grid structures and configured to transmit light at predetermined wavelengths to corresponding photoelectric conversion elements; and
 a plurality of microlenses disposed over the color filters, wherein the plurality of microlenses is consecutively arranged and, as a whole, forms a curved shape that is thinner at a center portion of the pixel array and thicker at an edge portion of the pixel array, and
 wherein the plurality of microlenses is formed to have different heights depending on their locations in the pixel array, and each of the microlenses has a flat top surface, and top surfaces of neighboring microlenses of the plurality of microlenses are consecutively arranged.

2. The image sensing device according to claim 1, wherein heights of the grid structures are shorter at the center portion of the pixel array than the edge portion of the pixel array and gradually increase in height as approaching the edge portion of the pixel array.

3. The image sensing device according to claim 1, wherein the grid structures include:
 an air layer; and
 a capping film formed to cover the air layer.

4. The image sensing device according to claim 3, wherein the capping film is formed to extend to regions below the color filters.

5. The image sensing device according to claim 3, wherein the grid structures further include:
 a metal layer disposed over the substrate layer,
 wherein the air layer is disposed over the metal layer, and
 the capping film is formed to cover the air layer and the metal layer.

6. The image sensing device according to claim 5, further comprising:
 an insulation film formed to cover a top surface of the metal layer and side surfaces of the metal layer.

7. The image sensing device according to claim 6, wherein the insulation film is formed to extend to regions below the color filters.

* * * * *